(12) United States Patent
Oki

(10) Patent No.: US 6,873,274 B2
(45) Date of Patent: Mar. 29, 2005

(54) DIGITAL-TO-ANALOG CONVERTER WITH SAMPLING FREQUENCY DETECTOR

(75) Inventor: Masashi Oki, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/245,674

(22) Filed: Sep. 18, 2002

(65) Prior Publication Data

US 2003/0179116 A1 Sep. 25, 2003

(30) Foreign Application Priority Data

Mar. 25, 2002 (JP) ......................................... 2002-084004

(51) Int. Cl.$^7$ ........................... H03M 3/00; H03M 1/06
(52) U.S. Cl. ......................................... 341/143; 341/118
(58) Field of Search ............................... 341/143, 118, 341/120, 144, 61; 375/222, 340; 370/503

(56) References Cited

U.S. PATENT DOCUMENTS

| | | | |
|---|---|---|---|
| 5,200,750 A | * | 4/1993 | Fushiki et al. .............. 341/143 |
| 5,220,326 A | * | 6/1993 | Ledzius et al. ............. 341/118 |
| 5,339,079 A | * | 8/1994 | Ledzius et al. ............. 341/144 |
| 5,600,320 A | * | 2/1997 | Wilson et al. .............. 341/144 |
| 5,617,088 A | * | 4/1997 | Yasuda ......................... 341/61 |
| 5,682,162 A | * | 10/1997 | Hamasaki et al. .......... 341/144 |
| 5,786,778 A | * | 7/1998 | Adams et al. ................. 341/61 |
| 6,028,542 A | * | 2/2000 | Fukui et al. ................. 341/123 |
| 6,072,843 A | * | 6/2000 | Baker et al. ................ 375/340 |
| 6,181,266 B1 | * | 1/2001 | Toki ............................ 341/152 |
| 6,639,531 B1 | * | 10/2003 | Melanson .................... 341/143 |
| 6,724,332 B1 | * | 4/2004 | Melanson .................... 341/143 |

FOREIGN PATENT DOCUMENTS

JP          11-66748       3/1999

* cited by examiner

*Primary Examiner*—Patrick Wamsley
(74) *Attorney, Agent, or Firm*—Leydig, Voit & Mayer, Ltd.

(57) ABSTRACT

A digital-to-analog (DA) converter includes a detector for detecting an input sampling frequency of digital data using a sampling clock and a master clock, an oversampling digital filter for oversampling the digital data on the basis of the input sampling frequency, an input sampling frequency change detector for detecting a change in the input sampling frequency, and a mute control for muting the data to be DA-converted on the basis of the detection result of the input sampling frequency change detector.

7 Claims, 10 Drawing Sheets

FIG.5

| LRCK FREQUENCY RANGE [kHz] | COUNT VALUE RANGE | COUNT VALUE ANALYSIS (fs DECISION) RESULT [kHz] | fs DETECTION RESULT BIT PATTERN | | | |
|---|---|---|---|---|---|---|
| | | | 4 | 3 | 2 | 1 |
| 27.7~37.3 | 444~329 | 32 | 0 | 0 | 0 | 0 |
| 37.5~45.9 | 328~326 | 44.1 | 0 | 0 | 0 | 1 |
| 46.0~55.1 | 267~223 | 48 | 0 | 0 | 1 | 0 |
| 55.4~74.9 | 222~164 | 64 | 0 | 1 | 0 | 0 |
| 75.4~91.7 | 163~134 | 88.2 | 0 | 1 | 0 | 1 |
| 92.4~110.7 | 133~111 | 96 | 0 | 1 | 1 | 0 |
| 111.7~148.0 | 110~83 | 128 | 1 | 0 | 0 | 0 |
| 149.9~183.4 | 82~67 | 176.4 | 1 | 0 | 0 | 1 |
| 186.2~198.2 | 66~62 | 192 | 1 | 0 | 1 | 0 |

DIGITAL-TO-ANALOG CONVERTER WITH SAMPLING FREQUENCY DETECTOR

BACKGROUND OF THE INVENTION

1. Field of the Invention

The present invention relates to a digital to analog converter that lightens the load of control imposed on an external device such as a Microprocessor in digital audio equipment or the like.

2. Description of the Related Art

FIG. 8 is a block diagram indicating the configuration of a digital audio apparatus using a conventional delta-sigma digital to analog converter (hereinafter referred to as a Δ ΣDAC). In this figure, reference numeral 101 denotes an audio source such as a CD, MD or DVD. Reference numeral 102 denotes audio input means including a digital signal processor (hereinafter referred to as a DSP), a digital audio interface receiver (hereinafter referred to as a DIR), and an AD converter (hereinafter referred to as an ADC). Reference numeral 103 denotes a Δ ΣDAC, reference numeral 104 denotes audio output means, reference numeral 105 denotes an analog low pass filter, reference numeral 106 denotes a power driver and reference numeral 107 denotes an LC low pass filter.

The operation will then be described.

In the digital audio apparatus shown in FIG. 8, the audio input means 102 reads data recorded on the audio source, generates a Pulse Code Modulation (hereinafter referred to as PCM) type digital audio signal from the data and outputs the signal to the delta sigma DAC 103. The delta sigma DAC 103 converts the incoming PCM type digital audio signal into a Pulse Width Modulation (hereinafter referred to as PWM) type pulse signal and outputs the signal to the audio output means 104. To output an analog audio signal to the corresponding analog audio line, the audio output means 104 has the received PWM type pulse signal go through the analog low pass filter 105. In addition, to drive a speaker for acoustic output, the audio output means 104 inputs the received PWM type pulse signal to the power driver 106 which amplifies the voltage level of the pulse signal to generate a power output signal via the low pass filter 107.

FIG. 9 is a block diagram of a conventional Δ Σ type DA converter. In the figure, reference numeral 103 denotes a delta sigma DAC, reference numeral 110 denotes an audio interface receiving data (referred to as DATA in the figure), a bit clock BCK, and an input sampling clock LRCK, which are acquired from the audio source 101, reference numeral 111 denotes an oversampling digital filter, reference numeral 112 denotes a sampling rate converter, reference numeral 113 denotes Δ Σ conversion means, reference numeral 114 denotes PWM conversion means, reference numeral 115 denotes a Microprocessor interface which receives control signals from external control means such as a Microprocessor equipped outside the delta sigma DAC 103, reference numeral 116 denotes an input side master clock synchronization unit, and reference numeral 117 denotes an output master clock synchronization unit. The input side master clock synchronization unit 116 is provided with the audio interface 110 and the oversampling digital filter 111, both of which operate in synchronization with an input side master clock xfsi. The output side master clock synchronization unit 117 is provided with the delta sigma conversion means 113 and the PWM conversion means 114, both of which operate in synchronization with an output side master clock xfso. The sampling rate converter 112 has its former stage operate in synchronization with the input side master clock xfsi and its latter stage operates in synchronization with the output side master clock xfso. The sampling rate converter 112 is configured so as to belong to both the input side master clock synchronization unit 116 and output side master clock synchronization unit 117.

The operation will next be described.

An audio signal output from the audio input means 102 as PCM type data is taken into the Δ ΣDAC 103 via the audio interface 110. The oversampling digital filter 111 receives audio signal data from the audio interface 110 and perform reflection-preventive low pass filtering operations of the data and oversamples the data based on the input sampling frequency fs. The oversampling digital filter 111 shown in FIG. 9 is configured so as to perform oversampling at a frequency either two, four or eight times higher than the input sampling frequency fs.

The sampling rate converter 112 improves the S/N ratio of the output of the ΔΣ DAC 103 by removing jitter from the clock signal used in generating the PWM type pulse signal. The input side master clock xfsi to be synchronized with the audio signal data is usually generated by a phase lock loop circuit (hereinafter referred to as a PLL) synchronized with the input sampling frequency fs although the PLL is not shown in the figure. However, since suppressing the accompanying jitter by the PLL is limited, the jitter is transmitted to the PWM type pulse signal outputted by the ΔΣ DAC 103, which causes a critical deterioration in the S/N ratio of the DAC output. Thus while the former stage of the sampling rate converter 112 operates in synchronization with the input side master clock xfsi, the latter stage of the sampling rate converter 112 is designed to operate in synchronization with a high accuracy clock generated using a quartz oscillator (not shown in the figure) asynchronous with the input side master clock xfsi. The output of the PWM pulse signal is maintained highly accurate by interrupting the propagation of jitter in this manner.

In the ΔΣ conversion means 113, the data output from the sampling rate converter is quantized into a small number of bits while the quantization noise is given a differential characteristic or higher frequency band enhancement (noise shaping). In the PWM conversion means 114, the data consisting of a small number of bits from the ΔΣ conversion means 113 is converted into a 1-bit PWM pulse signal whose pulse width varies. The 1-bit PWM pulse signal can be converted into an analog signal only by allowing the signal to go through a low pass filter such as the analog low pass filter 105 or the LC low pass filter 107.

Here, the operation of the oversampling digital filter 111 will be described in detail. The oversampling digital filter 111 shown in FIG. 9 performs eight-time-oversampling when it receives, for example, 1 fs (32 kHz to 48 kHz) of a digital audio signal, namely, data of inputted sampling frequency fs; the filter 111 performs four-time-oversampling when it receives 2 fs (64 kHz to 96 kHz); and the filter 111 performs two-time-oversampling when it receives 4 fs (128 kHz to 192 kHz). In this manner, the oversampling digital filter 111 oversamples the audio signal data always at a fixed frequency of 8 fs.

Switching the oversampling operation according to the input sampling frequency fs is performed under control of external control means such as a Microprocessor located outside the ΔΣ DAC 113. The external control means must control the delta sigma DAC 113 so as to change the oversampling frequency depending on the selected audio source 101 such as a CD, MD, or DVD. If there are a plurality of audio input means 102 each incorporating a DSP, DIR, and ADC, the external control means is also in charge of allowing the ΔΣ DAC 103 to selectively receive a signal from the plurality of audio input means 102 to acquire the input sampling frequency fs. In addition, it is necessary to provide mute processing to prevent abnormal sound from being introduced into the audio signal data when the audio source 101 is switched.

FIG. 10 is a block diagram of a conventional ΔΣ DAC having another configuration. Like or corresponding parts of the ΔΣ DAC 103 in FIG. 9 are denoted by the same reference numeral as in FIG. 9 and the explanation thereof is omitted. The ΔΣ DAC 103 in FIG. 10 is different from the ΔΣ DAC 103 in FIG. 9 in that the sampling rate converter 112 is not included. Although a second PLL is provided to suppress the jitter of the master clock xfs in this configuration, it is virtually impossible to raise the performance by suppressing the jitter to the same level as the ΔΣ DAC 103 shown in FIG. 9 where the output side master clock xfso is generated from a quartz oscillator independent of the input side master clock xfsi. In addition, control by external control means such as a Microprocessor to adapt the operation to the input sampling frequency fs which changes depending on each selected audio source 101 is also necessary for the ΔΣ DAC 103 in FIG. 10.

FIG. 11 is a block diagram of a conventional ΔΣ DAC having yet another configuration. Like or corresponding parts of the ΔΣ DAC 103 in FIG. 9 are denoted by the same reference numerals as in FIG. 9 and the explanation thereof is omitted. The ΔΣ DAC 103 shown in FIG. 11 is configured in such a manner that the ratio of the oversampling frequency to the input sampling frequency fs is fixed. This configuration can release the external control means from some burdens of input sampling frequency-dependent control. However, to support a high input sampling frequency in this configuration, it is necessary to simply raise the frequency of the master clock xfs for operational synchronization and therefore raise the operation speed of the ΔΣ DAC 103. However, configuring a high speed ΔΣ DAC is not easy because it is necessary to overcome such problems as spurious radiation and high power consumption due to high speed switching, and followability to high speed switching pulses by the analog low pass filter 105, the power driver 106 and others governing the output operation of the ΔΣ DAC 103.

As described above, however, the conventional ΔΣ DAC have problems if the audio source is switched, an external control means, such as a Microprocessor, must acquire the input sampling frequency associated with the new audio source and adapt the operation of the ΔΣ DAC to the input sampling frequency, and while the audio source is being switched, the external control means must provide mute control to the ΔΣ DAC.

SUMMARY OF THE INVENTION

The present invention has been made to solve the problems mentioned above, and it is an object of the present invention to provided a digital to analog converter which changes an input sampling frequency by itself when an audio source is switched and lightens a load of control imposed on the externally equipped control means.

According to one aspect of the present invention, there is provided a digital to analog converter which comprises sampling frequency detection means for detecting a sampling frequency of digital data by using a master clock and a sampling clock received together with digital data; and oversampling means for oversampling the digital data on the basis of the sampling frequency, and performs digital to analog conversion by inputting the digital data, oversampled by the oversampling means, to digital to analog conversion means.

According to another aspect of the present invention, there is provided a digital to analog converter which comprises sampling frequency detection means for detecting a sampling frequency of digital data by using a master clock and a sampling clock received together with the digital data; and operation control means for performing operational processing on the digital data on the basis of the sampling frequency, and inputs the digital data processed by the operation control means to the over sampling means and inputs the oversampled data to digital to analog conversion means for digital to analog conversion.

Thus, according to the present invention, external control means such as a Microprocessor equipped outside the digital to analog converter need not provide control to the digital to analog converter when the sampling frequency is changed and therefore the load of control imposed on the control means is lightened.

BRIEF DESCRIPTION OF THE DRAWINGS

FIG. 5 is a diagram for explaining the judgment processing of the fs detection means in the ΔΣ DAC according to the first embodiment;

DETAILED DESCRIPTION OF THE PREFERRED EMBODIMENTS

Embodiments of the present invention will be described below.

First Embodiment

Figure 1:
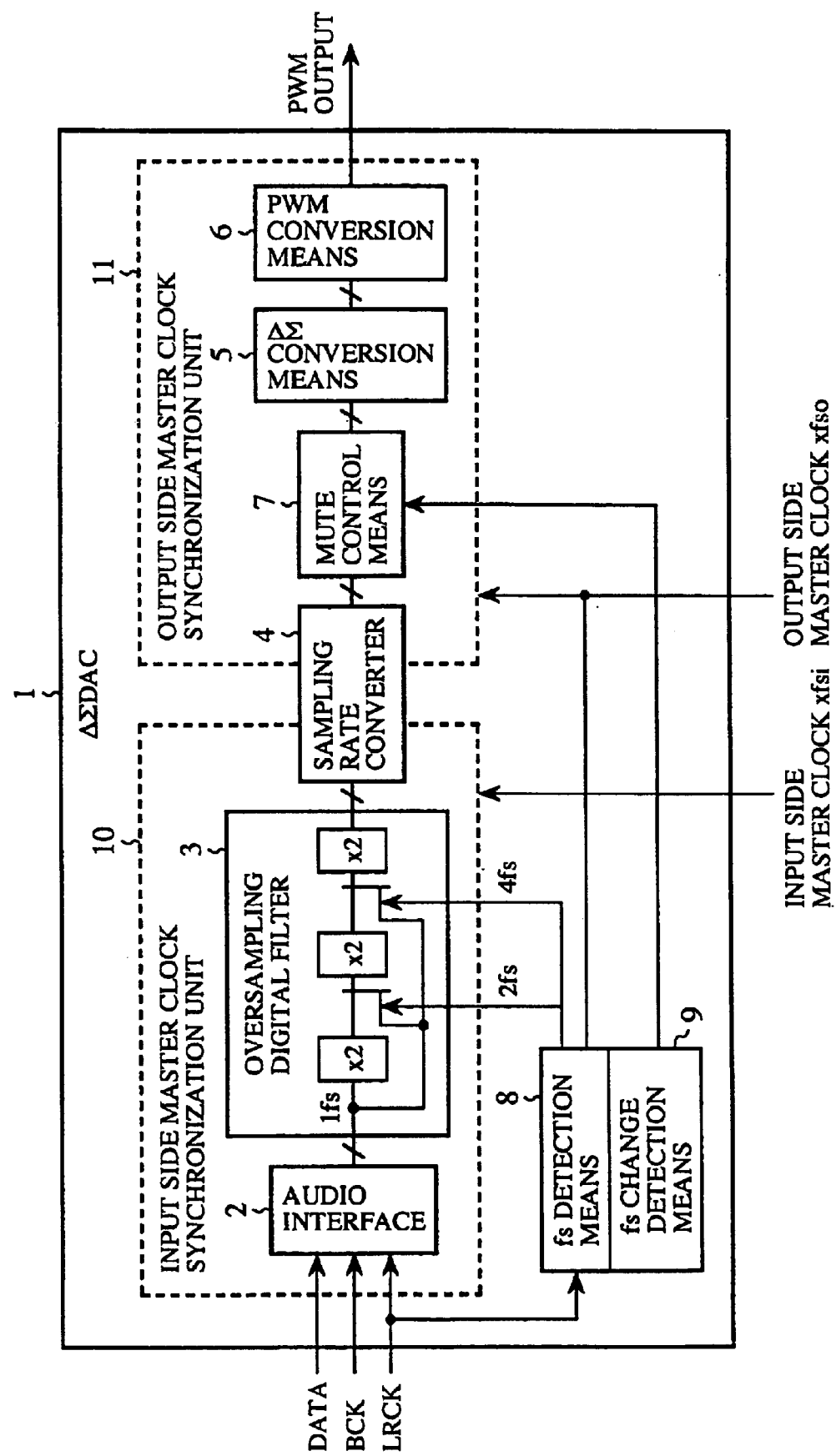
FIG. 1 is a block diagram of a ΔΣ DAC according to a first embodiment of the present invention.

FIG. 1 is a block diagram showing the configuration of a digital to analog converter according to a first embodiment of the present invention. In the figure, reference numeral 1 denotes a delta sigma type digital to analog converter (hereinafter referred to as a Δ ΣDAC), 2 denotes an audio interface, 3 denotes an oversampling digital filter (oversampling means), 4 denotes a sampling rate converter, 5 denotes Δ Σ conversion means (DA conversion means), 6 denotes PWM conversion means (DA conversion means), 7 denotes mute control means (muting means), 8 denotes fs detection means (sampling frequency detection means), 9 denotes fs change detection means (sampling frequency change detection means), 10 denotes an input side master clock synchronization unit, and 11 denotes an output master clock synchronization unit.

The input side master clock synchronization unit 10 is provided with the audio interface 2 and the oversampling digital filter 3, both of which operate in synchronization with an input side master clock xfsi supplied from the outside of the Δ ΣDAC 1. The output side master clock synchronization unit 11 is provided with the mute control means 7, the Δ Σ conversion means 5 and the PWM conversion means 6, all of which operate in synchronization with an output side master clock xfso (master clock) supplied from the outside of the Δ ΣDAC 1 or from an oscillation circuit (not shown in the figure) provided within the Δ ΣDAC 1. The sampling rate converter 4 has a former stage that operates in synchronization with the input side master clock xfsi and a latter stage that operates in synchronization with the output side master clock xfso. The sampling rate converter 4 is configured so as to belong to both of the input side master clock synchronization unit 10 and the output side master clock synchronization unit 11.

Then the operation of the DA converter will be described.

Figure 2:
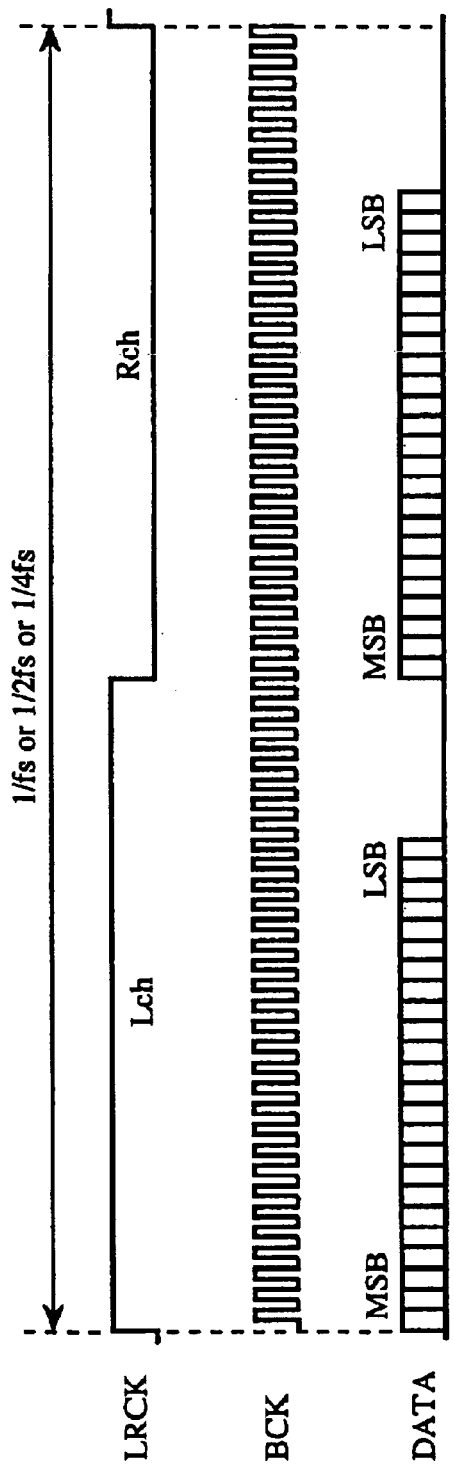
FIG. 2 is a diagram for explaining signals that are provided to the ΔΣ DAC according to the first embodiment.

FIG. 2 is a diagram for explaining the signals supplied to the DA converter implemented according to the first embodiment. For example, via an optical cable, the Δ ΣDAC 1 receives serially incoming audio signal data (referred to as DATA in the figure), an input sampling LRCK (sampling clock) to switch between the L channel and the R channel, and a bit clock BCK used for such purposes as to identify each bit of the data. The frequency of the input sampling clock LRCK is treated as the input sampling frequency fs (sampling frequency). For DA converters in audio products, 32 kHz, 44.1 kHz, 48 kHz, two times them and four times them are generally used as input sampling frequencies fs.

In this case, the audio interface 2 shown in FIG. 1 receives the audio signal data, the bit clock BCK, and the input sampling clock LRCK via an optical cable for example. The oversampling digital filter 3 receives the audio signal data from the audio interface 2, performs low pass filtering operations on the audio signal data and oversamples the data on the basis of the input sampling frequency fs output from the fs detection means 8. The oversampling digital filter 3 shown in FIG. 1 is configured so as to perform oversampling at a frequency either two times, four times or eight times higher than fs.

In the sampling rate converter 4, sampled data from the oversampling digital filter 3 is sent to the mute control means 7 in synchronization with the output side master clock xfso. The mute control means 7 provides mute processing to the output data of the sampling rate comparator 9 on the basis of the fs change detection signal from the fs change detection means 9. In the Δ Σ conversion means 5, data from the mute control means 7 is quantized into a small number of bits by giving noise shaping to the quantization noise of the data. In the PWM conversion means 6, the quantized data from the delta sigma conversion means 5 is converted into a 1-bit PWM type pulse signal.

Meanwhile, the fs detection means 8 measures the period of the input sampling clock LRCK received by the Δ ΣDAC 1 by counting the output side master clock xfso in order to detect the input sampling frequency fs of the audio signal data received together with the input sampling clock LRCK. This makes it possible for the delta sigma DAC 1 to adapt the oversampling to the incoming data without being controlled by externally equipped control means. Incidentally, the frequency-fixed output side master clock xfso is used here. This is because the input side master clock xfsi is generated outside the Δ ΣDAC 1 in synchronization with the input sampling clock LRCK and therefore cannot accurately detect changes in the period or pulse width of the input sampling clock LRCK.

The delta sigma DAC 1 shown in FIG. 1 adjusts the oversampling ratio according to the input sampling frequency fs so that the oversampling frequency is maintained at a fixed value of 8 fs. The fs detection means 8 is set such as to detect a predetermined range of frequency; for example, the input sampling frequency fs in the range of 32 kHz to 48 kHz is detected as 1 fs; fs in the range of 64 kHz to 96 kHz is detected as 2 fs; fs in the range of 128 kHz to 192 kHz is detected as 4 fs. If 1 fs (32 kHz to 48 kHz) is detected by the fs detection means 8, the oversampling is done at a frequency 8 times higher than fs. Likewise, the oversampling ratio is set to 4 and 2 when 2 fs (64 kHz to 96 kHz) and 4 fs (128 kHz to 192 kHz) are detected, respectively.

In addition, the fs change detection means 9 monitors the fs detection result of the fs detection means 8, and if the input sampling frequency fs changes, the fs change detection means 9 maintains the fs change detection signal for a certain period for output to the mute control means 7 which in turn subjects the audio signal data to mute processing in order to suppress noise generated when the input sampling frequency fs is switched.

The configuration and operation of the fs detection means 8 are next described in detail.

Figure 3:
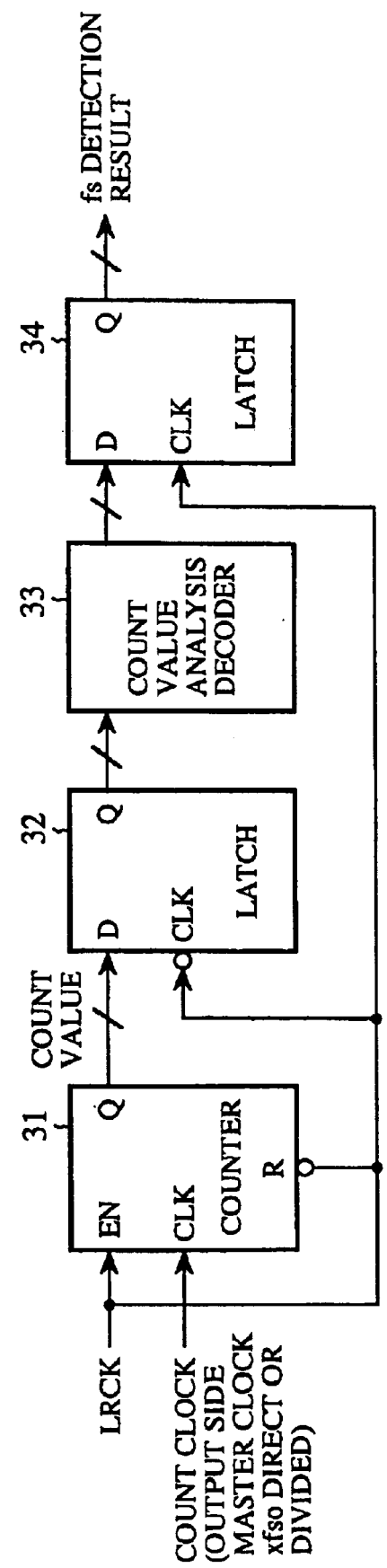
FIG. 3 is a block diagram showing a configuration of fs detection means in the ΔΣ DAC according to the first embodiment.

FIG. 3 is a block diagram indicating the configuration of the fs detection means 8 in the DA converter according to the first embodiment. In the figure, reference numeral 31 denotes a counter, 32 denotes a latch made up of a flip-flow circuit to latch the count value of the counter 31, 33 denotes a count value analysis decoder (sampling frequency judgment means), and 34 is a latch made up of a flip-flop circuit to latch the output of the count value analysis decoder 33.

Figure 4:
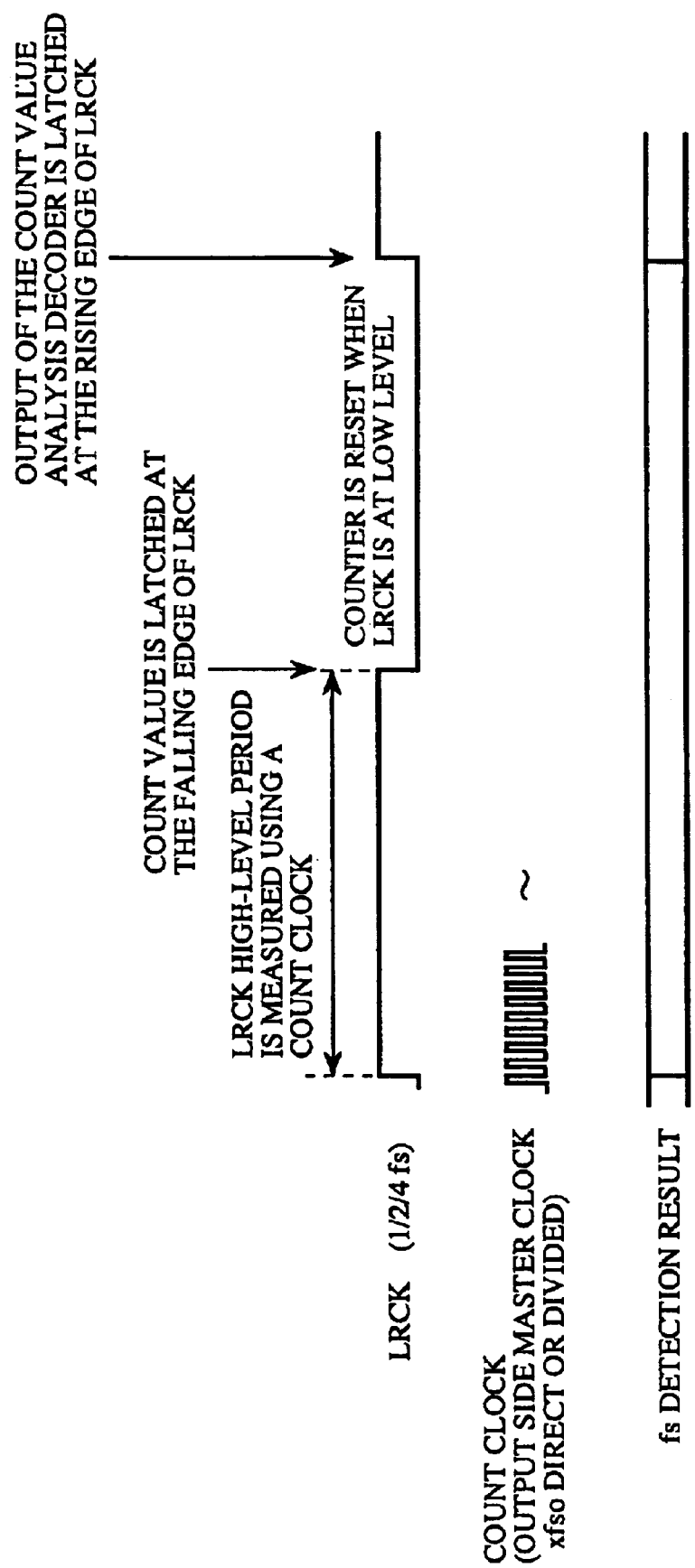
FIG. 4 is a diagram for explaining the operation of the fs detection means in the ΔΣ DAC according to the first embodiment.

FIG. 4 is an explanatory diagram indicating the operation of the fs detection means 8 in the DA converter according to the first embodiment. The Δ ΣDAC 1 shown in FIG. 1 allows the audio interface 2 to receive the data, the bit clock BCK, and the input sampling clock LRCK, and allows the fs detection means 8 to receive the input sampling clock LRCK. In addition, the fs detection means 8 receives the output side master clock xfso from the outside of the delta sigma DAC 1 and uses it as a count clock. The output side master clock xfso is directly used or frequency-divided by a frequency divide circuit (not shown in the figure) before used as the count clock. The fs detection result is output at the timing shown in FIG. 4.

FIG. 5 is an explanatory diagram illustrating the judgment processing of the fs detection means 8 in the DA converter according to the first embodiment. FIG. 5 indicates an example of the frequencies of the input sampling clock LRCK, the clock count values obtained for the input sampling clock LRCK, the associated count value analyses, namely, detected input sampling frequencies fs, and the decoded results of the associated input sampling frequencies outputted from the count value analysis decoder 33.

Next, the operation of the fs detection means 8 is explained with reference to FIG. 4. The counter 31 receives a count clock of the output side master clock xfso and the input sampling clock LRCK received by the Δ ΣDAC 1. The counter 31 measure the period during which the input sampling clock LRCK is at a high level, that is, the semi-period of the input sampling clock LRCK by using the count clock. If a falling edge of the input sampling clock LRCK is detected, the latch 32 latches the current count value that is output from the counter 31. When the input sampling clock is at a low level, the counter 31 is reset and the latched count value is output to the count value analysis decoder 33 where decoding is done in such a manner as shown in FIG. 5.

The example count value analysis decode processing by the fs detection means 8, shown in FIG. 5, is based on the assumption that the count clock frequency is 512×48 kHz. The count value analysis decoder 33 extracts a count value range which encompasses the count value measured for the input sampling clock LRCK, and detects an input sampling frequency fs from the count value analyses (fs decision) which is associated with the detected count value range. If the input sampling clock LRCK count value does not fall in any count value rage, the operation is judged abnormal and the audio signal is muted.

The detected input sampling frequency fs is decoded into a 4-bit code in the example shown in FIG. 5. Also note that while 512×48 kHz is assumed as the frequency of the count clock in FIG. 5, 1024×48 kHz, 512×44.1 kHz and other count clock frequencies may also be used to define count value ranges in such a way as to be suited to these frequencies, allowing the input sampling frequency fs to be detected in the same manner. For example, narrowing each count value range raises the accuracy of the detected input sampling frequency fs.

After the count value analysis decoder 33 detects the input sampling frequency fs from the count value of the input sampling clock LRCK, the input sampling clock LRCK switches from the low to high level. At this time, the latch 34 detects the rising edge of the input sampling clock LRCK and latches the current 4-bit code which is output from the count value analysis decoder 33. In the operation shown in FIG. 4, the latch 34 updates its fs detection result output every one period of the input sampling clock LRCK. The fs detection result, obtained in this manner, is provided from the fs detection means 8 to the oversampling digital filter 3 which in turn uses the result to adjust the oversampling ratio.

The configuration and operation of the fs change detection means will be explained in detail below.

Figure 6:
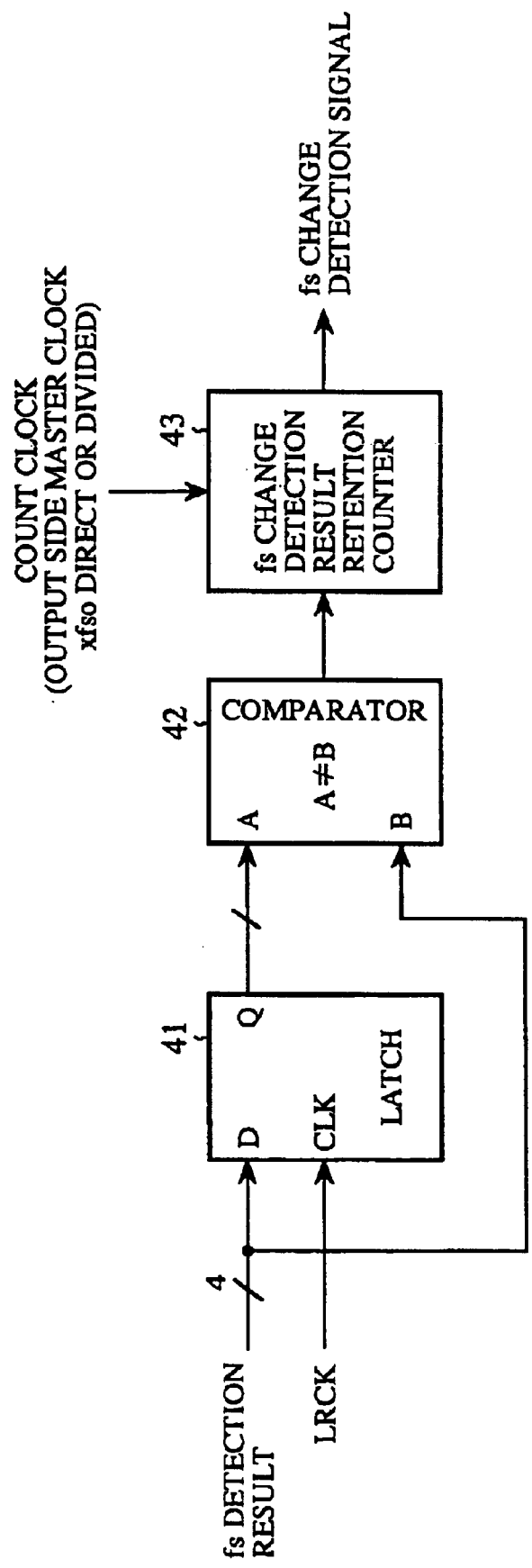
FIG. 6 is a block diagram showing a configuration of an fs change detected in the ΔΣ DAC according to the first embodiment.

FIG. 6 is a block diagram showing the configuration of the fs change detection means 9 in the DA converter according to the first embodiment. In the figure, reference numeral 41 denotes a latch made up of a flip-flop circuit, etc, 42 denotes a 2-input comparator, and 43 denotes an fs change detection signal retention period counter (retention means).

The operation of the fs change detection means is explained below.

The latch 41 receives the fs detection result from the fs detection means 8 and the input sampling clock LRCK. When the input sampling clock LRCK is at the high level, the latch 41 latches the received fs detection result and provides it to a port A of the comparator 42. When the input sampling clock LRCK switches to the low level, the fs-detection result outputted from the fs detection means 8 is provided to port B of the comparator 42 but not latched by the latch 41. That is, the port A of the comparator 42 is given the fs detection result latched by the latch 41 while the port B of the comparator 42 is given the current fs detection result by the fs detection means 8. The comparator 42 compares the two fs detection results that are present at the ports A and B, respectively. If the two are different, the comparator 42 judges that the input sampling frequency fs has changed, and outputs the fs change detection signal indicative of activeness.

The active fs change detection signal is provided to the mute control means 7 by way of the fs change signal retention period counter 43 used to keep the fs change detection signal active for a predetermined period. By making the fs change detection signal retention period enough long for the oversampling digital filter 3 and the sampling rate converter to replace the old input sampling frequency fs-used internal operation data with the new input sampling frequency-used operational data, it is possible to prevent the switched input sampling frequency fs from causing noise.

As described so far, the Δ ΣDAC 1 according to the first embodiment detects the input sampling frequency fs from the input sampling clock LRCK by using the output side sampling frequency fso, automatically adapts the operation of the oversampling digital filter according to the input sampling frequency and performs muting to suppress noise when the input sampling frequency fs is changed. Thus, the first embodiment provides an effect of reducing the load of control imposed on external control means such as a Microprocessor equipped outside the Δ ΣDAC 1 because external control, including muting control, is not needed when the input sampling frequency fs is changed.

Second Embodiment

Figure 7:
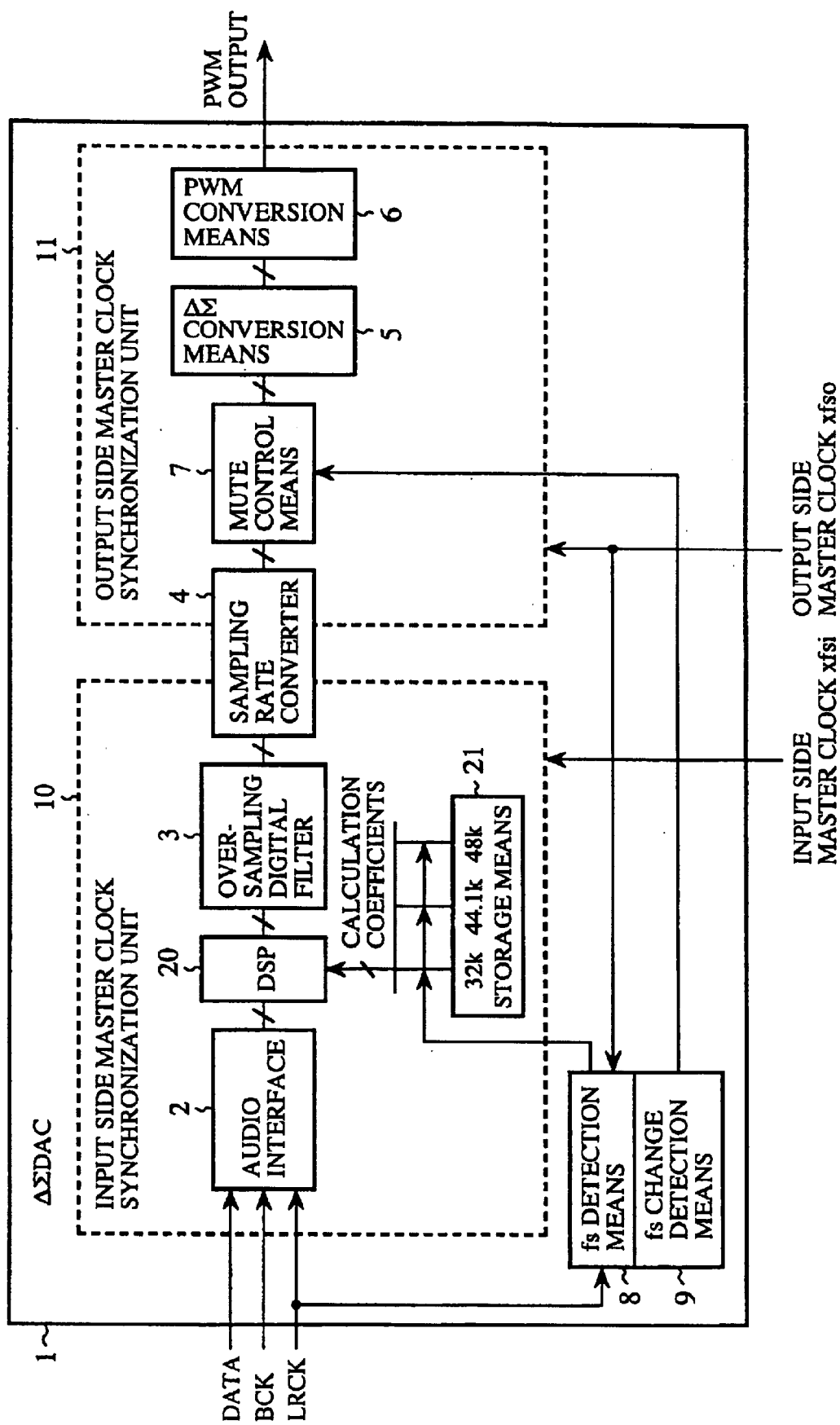
FIG. 7 is a block diagram showing a configuration of a ΔΣ DAC according to a second embodiment of the present invention.
Figure 8:
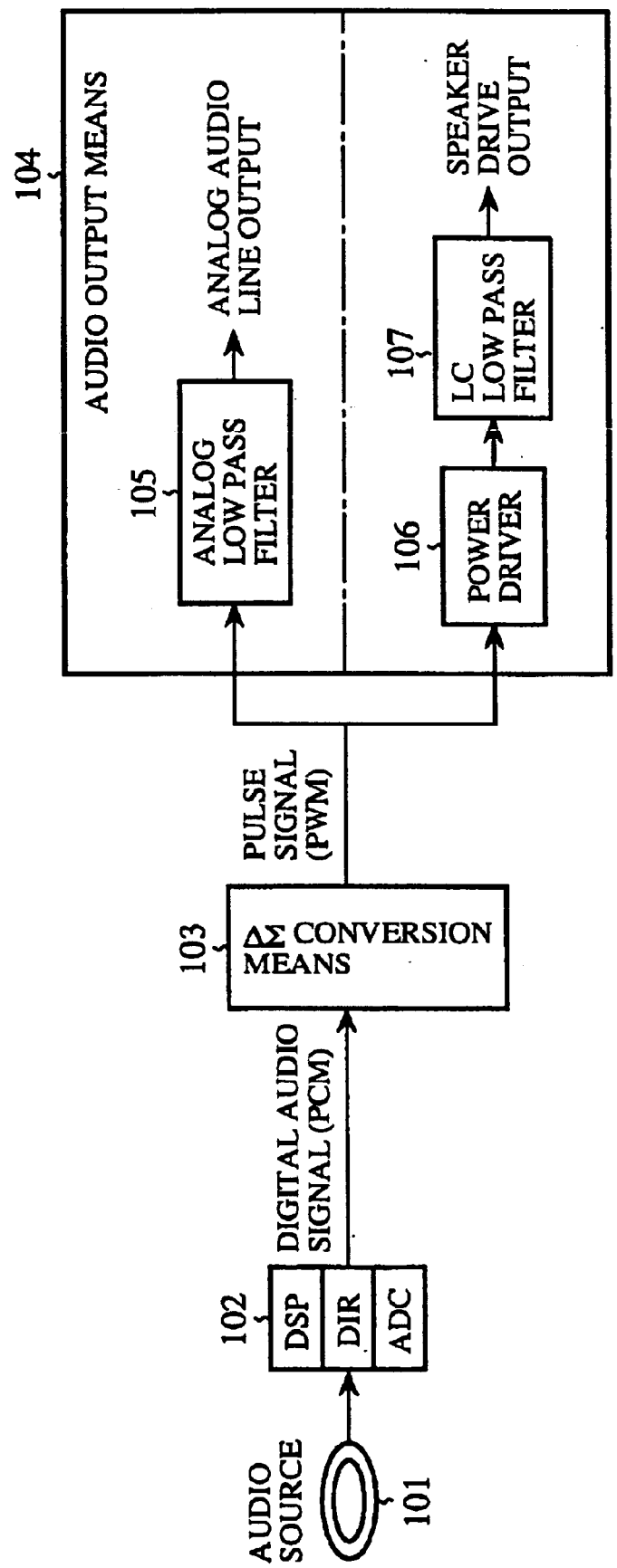
FIG. 8 is a block diagram showing a configuration of a digital audio device using a conventional ΔΣ DAC.
Figure 9:
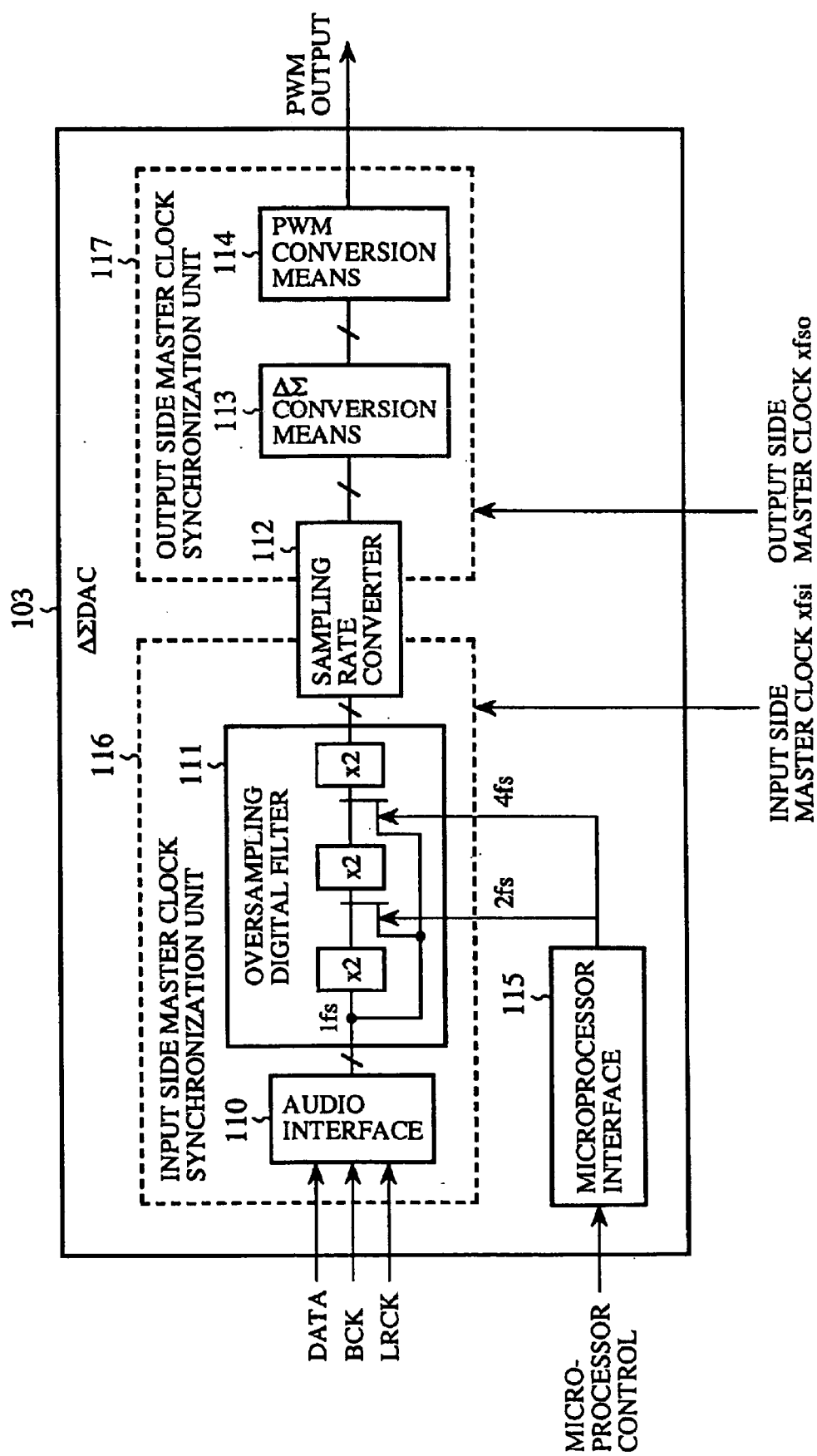
FIG. 9 is a block diagram showing a configuration of the conventional ΔΣDAC.
Figure 10:
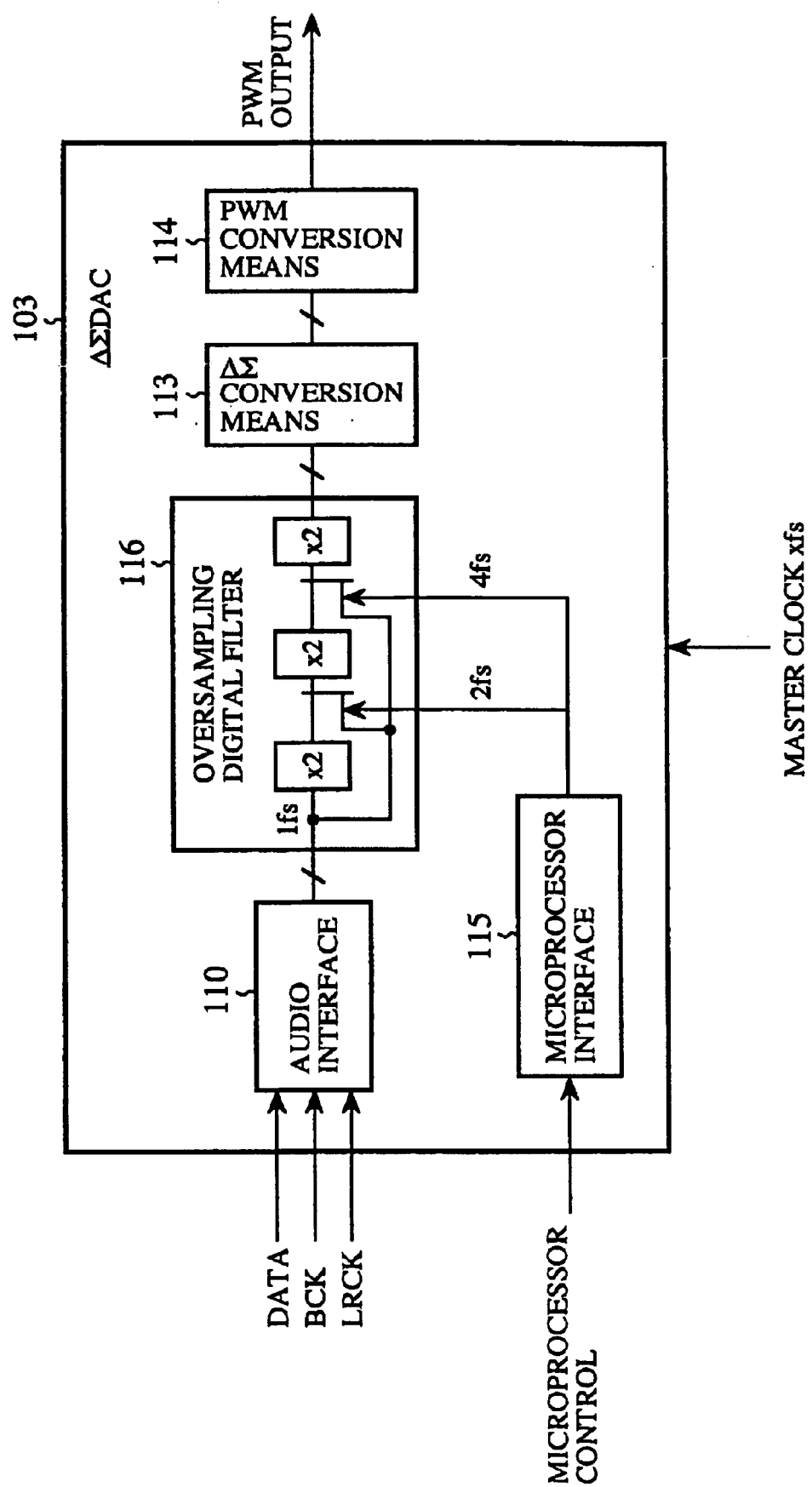
FIG. 10 is a block diagram of a conventional ΔΣ DAC having another configuration.
Figure 11:
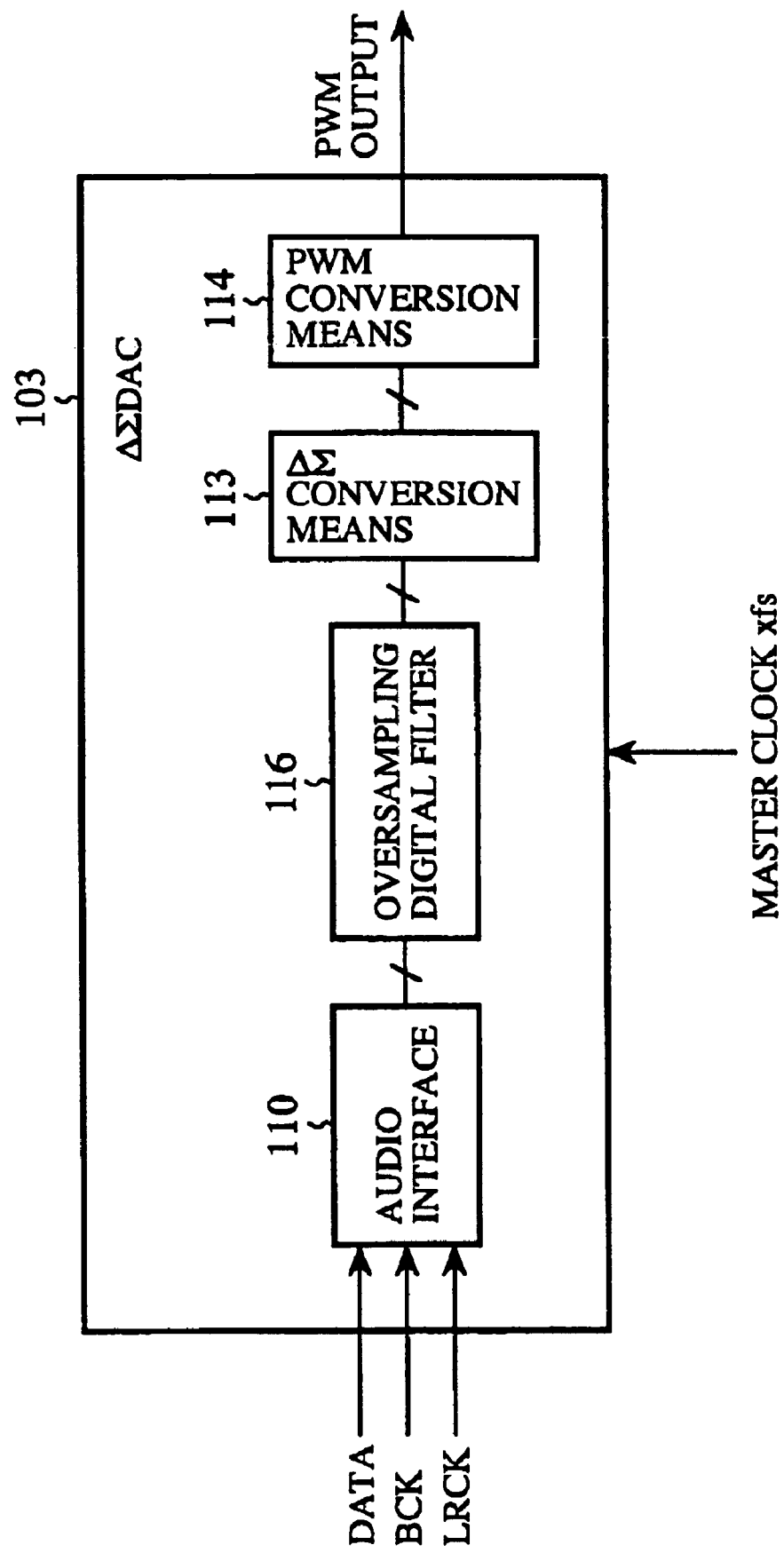
FIG. 11 is a block diagram of a conventional ΔΣ DAC having yet another configuration.

FIG. 7 is a block diagram showing the configuration of a Δ Σ DA converter according to a second embodiment of the present invention. Each unit which is identical or corresponds to a unit in FIG. 1 is given the same reference numeral and its explanation is omitted. In the figure, reference numeral 20 denotes a digital signal processor (hereinafter denoted as DSP; operation control means). In the Δ ΣDAC 1 according to the second embodiment, the DSP 20 functions as a digital filter like an equalizer or de-emphasis employed in audio equipment, for example. The DSP 20 performs filtering operations while automatically changing filter coefficients based on the input sampling frequency fs. Reference numeral 21 denotes storage means such as a ROM and stores the filter coefficients used in filtering operations. In this storage means 21, filter coefficients associated with respective input sampling frequencies fs, for example, 32 kHz, 44.1 kHz and 48 kHz, are stored.

Next the operation of the Δ ΣDAC 1 according to the second embodiment will be described.

Encompassing the delta sigma DAC 1 according to the first embodiment, the delta sigma DAC 1 according to the second embodiment further comprises the DSP 20 and the storage means 21. Explanation of the other units is omitted because they operate in the same manner as the counterparts given the same reference numerals in FIG. 1. Here, explanation is focused on portions unique to the DA converter according to the second embodiment. In the Δ ΣDAC 1 shown in FIG. 7, the audio signal data output from the audio interface 2 is provided to the DSP 20. Retrieving filter coefficients from the storage means 21, the DSP 20 performs filtering operations on the data by using the retrieved filter coefficients. The processed data is then provided to the oversampling digital filter 3 where oversampling is done. The subsequent operations by the sampling rate converter 4, the mute control means 7, the Δ Σ conversion means 5 and the PWM conversion means 6 are same as those in the Δ ΣDAC 1 shown in FIG. 1.

In addition, the fs detection means 8 and the fs change detection means 9 basically operate in the same manner. The fs detection result, output from the fs detection means 8, is input to the DSP 20 for use in selecting filter coefficients. The DSP 20 retrieves filter coefficients from the storage means 21 on the basis of the fs detection result retrieved from the fs detection means 8, and performs filtering operations on the data input from the audio interface 2. Filter coefficients can be selected flexibly. For example, it is possible to select filter coefficients in such a manner as to ensure the filtered data can be processed at a fixed oversampling ratio not depending on the input sampling frequency fs. In this case, it is not necessary to control the oversampling digital filter 3 depending on a change in the input sampling frequency fs and it is possible to employ an oversampling digital filter 3 which performs oversampling always at a single frequency.

As described above, the $\Delta \Sigma$DAC 1 according to the second embodiment detects the input sampling frequency fs from the input sampling clock LRCK by using the output side sampling frequency fso, allows the DSP 20 to perform filtering operations by using filter coefficients suited for the input sampling frequency fs and subjects the data indicative of an audio signal to muting to suppress noise when the input sampling frequency fs is changed. Thus, the second embodiment provides an effect of reducing the load of control imposed on external control means such as a Microprocessor equipped outside the $\Delta \Sigma$DAC 1 because external control, including muting control, is not needed when the input sampling frequency fs is changed.

What is claimed is:

1. A digital-to-analog converter including:
    digital-to-analog (DA) conversion means receiving digital data and digital-to-analog-converting the digital data using a master clock;
    sampling frequency detection means for detecting a sampling frequency of the digital data using a sampling clock, received together with the digital data, and the master clock; and
    oversampling means for oversampling the digital data based on the sampling frequency, wherein the digital data oversampled by the oversampling means is input to the DA conversion means for digital to analog conversion.

2. The digital-to-analog converter according to claim 1, wherein
    the sampling frequency detection means comprises a sampling frequency change detection means for detecting a change in the sampling frequency and outputting a sampling frequency change detection signal, and
    the digital-to-analog conversion means comprises muting means for muting a signal be digital-to-analog-converted based on the sampling frequency change detection signal.

3. The digital-to-analog converter according to claim 2, wherein the sampling frequency change detection means comprises retention means for retaining the sampling frequency change detection signal for a predetermined period.

4. The digital-to-analog converter according to claim 1, wherein
    the sampling frequency detection means comprises a counter for measuring a period of the sampling clock using the master clock, and
    sampling frequency judgment means for determining the sampling frequency based on a counter value output from the counter.

5. The digital-to-analog converter according to claim 4, wherein the sampling frequency judgment means determines the sampling frequency according to the count value associated with a range.

6. A digital-to-analog converter including:
    oversampling means receiving digital data and oversampling the digital data;
    digital-to-analog conversion means for digital-to-analog-converting data output from the oversampling means using a master clock;
    sampling frequency detection means for detecting a sampling frequency of the digital data using a sampling clock received together with the digital data, and the master clock; and
    operation control means for performing an operation on the digital data based on the sampling frequency, wherein the digital data processed by the operation control means is input to the oversampling means for oversampling.

7. The digital-to-analog converter according to claim 6, wherein the operation control means comprises storage means for storing a calculation coefficient associated with the sampling frequency and the operation is performed using the calculation coefficient stored in the storage means.

* * * * *